United States Patent
Kim et al.

(10) Patent No.: US 11,139,542 B2
(45) Date of Patent: Oct. 5, 2021

(54) SEPARATOR FOR SECONDARY CELL HAVING EXCELLENT HEAT RESISTANCE AND SHUTDOWN PROPERTIES

(71) Applicants: SK Innovation Co., Ltd., Seoul (KR); SK IE TECHNOLOGY CO., LTD., Seoul (KR)

(72) Inventors: Hye Jin Kim, Daejeon (KR); Won Sub Kwack, Daejeon (KR); Min Sang Park, Daejeon (KR)

(73) Assignees: SK Innovation Co., Ltd., Seoul (KR); SK IE TECHNOLOGY CO., LTD., Seoul (KR)

( * ) Notice: Subject to any disclaimer, the term of this patent is extended or adjusted under 35 U.S.C. 154(b) by 161 days.

(21) Appl. No.: 16/551,146

(22) Filed: Aug. 26, 2019

(65) Prior Publication Data

US 2019/0386287 A1   Dec. 19, 2019

Related U.S. Application Data

(62) Division of application No. 15/366,649, filed on Dec. 1, 2016, now Pat. No. 10,431,805.

(30) Foreign Application Priority Data

Dec. 2, 2015   (KR) .......... 10-2015-0170487

(51) Int. Cl.
*H01M 2/34*   (2006.01)
*C23C 16/455*   (2006.01)
(Continued)

(52) U.S. Cl.
CPC ....... *H01M 50/581* (2021.01); *C23C 16/0245* (2013.01); *C23C 16/045* (2013.01);
(Continued)

(58) Field of Classification Search
CPC .. H01M 50/40; H01M 50/403; H01M 50/409; H01M 50/411; H01M 50/414;
(Continued)

(56) References Cited

U.S. PATENT DOCUMENTS

2007/0218290 A1   9/2007   Rajala et al.
2009/0286674 A1   11/2009   Fjellvag et al.
(Continued)

FOREIGN PATENT DOCUMENTS

CN   102163741 A   8/2011
CN   103137930 A   6/2013
(Continued)

OTHER PUBLICATIONS

Office Action issued by the China Intellectual Property Office dated Jun. 11, 2021.

*Primary Examiner* — Christopher P Domone
(74) *Attorney, Agent, or Firm* — IP & T Group LLP

(57) ABSTRACT

A separator for a secondary cell includes a porous polymer substrate having a first surface, a second surface opposing the first surface, and a plurality of pores connecting the first surface to the second surface; and heat-resistant coating layers formed on at least one of the first surface and the second surface of the porous polymer substrate and on internal surfaces of the pores using an atomic layer deposition process (ALD). Pores having a non-coated region are present in the internal surfaces of the pores.

8 Claims, 3 Drawing Sheets

(51) Int. Cl.
*C23C 16/52* (2006.01)
*H01M 2/14* (2006.01)
*H01M 2/16* (2006.01)
*H01M 50/581* (2021.01)
*C23C 16/02* (2006.01)
*C23C 16/04* (2006.01)
*C23C 16/40* (2006.01)
*H01M 50/403* (2021.01)
*H01M 50/411* (2021.01)
*H01M 50/431* (2021.01)
*H01M 50/446* (2021.01)
*H01M 50/449* (2021.01)

(52) U.S. Cl.
CPC ...... *C23C 16/403* (2013.01); *C23C 16/45527* (2013.01); *C23C 16/45555* (2013.01); *C23C 16/52* (2013.01); *H01M 50/403* (2021.01); *H01M 50/411* (2021.01); *H01M 50/431* (2021.01); *H01M 50/446* (2021.01); *H01M 50/449* (2021.01); *H01M 2200/10* (2013.01)

(58) Field of Classification Search
CPC ............. H01M 50/417; H01M 50/429; H01M 50/431; H01M 50/434; H01M 50/446
See application file for complete search history.

(56) References Cited

U.S. PATENT DOCUMENTS

| | | | |
|---|---|---|---|
| 2011/0200863 A1* | 8/2011 | Xiao | .................... H01M 50/411 |
| | | | 429/144 |
| 2012/0202103 A1 | 8/2012 | Yu et al. | |
| 2013/0260184 A1* | 10/2013 | Yu | ........................ H01M 50/411 |
| | | | 429/7 |
| 2015/0303427 A1 | 10/2015 | Hyun et al. | |
| 2016/0268571 A1* | 9/2016 | Honda | ................. H01M 50/411 |

FOREIGN PATENT DOCUMENTS

| | | |
|---|---|---|
| CN | 10373292 A | 4/2014 |
| CN | 105050808 A | 11/2015 |
| JP | 3797729 | 7/2006 |
| JP | 2006-503049 A | 1/2008 |
| JP | 2009-016279 | 1/2009 |
| JP | 2009-527091 A | 7/2009 |
| KR | 10-1439787 B1 | 3/2015 |
| WO | 2015/023116 A1 | 2/2015 |

\* cited by examiner

SEPARATOR FOR SECONDARY CELL HAVING EXCELLENT HEAT RESISTANCE AND SHUTDOWN PROPERTIES

CROSS-REFERENCE TO RELATED APPLICATION

This application claims the benefit of priority to Korean Patent Application No. 10-2015-0170487, filed on Dec. 2, 2015 with the Korean Intellectual Property Office, the entirety of which is incorporated herein by reference.

BACKGROUND

The present disclosure relates to a separator for a secondary cell interposed between an anode and a cathode, and a method of manufacturing the same.

Lithium ion secondary batteries commonly include, for example, anodes having composite lithium oxides, cathodes having materials capable of the absorption and emission of lithium ions, as well as separators and non-aqueous electrolyte solutions interposed between the anodes and the cathodes. Such anodes and cathodes are stacked with separators interposed therebetween, or are wound, after being stacked, to form winding electrodes having a columnar shape.

Separators function to electrically insulate anodes from cathodes, and to support non-aqueous electrolyte solutions. Microporous polyolefin membranes are commonly used to form separators for such lithium ion secondary batteries. Microporous polyolefin membranes have excellent electrical insulating properties and ion transmitting properties, and are widely used in separators for lithium ion secondary batteries or condensers.

Since lithium ion secondary batteries have a high output density and a high capacity density, but include non-aqueous electrolyte solutions, for example, organic solvents, the non-aqueous electrolyte solutions are decomposed by heat produced in an abnormal state, such as a short circuit or overcharging, and in the worst case, may ignite. In order to address these issues, lithium ion secondary batteries have several safety functions, one such safety function being a separator shutdown function.

The separator shutdown function is provided such that the micropores of separators are occluded by thermally molten resin materials when lithium ion secondary batteries generate abnormal amounts of heat, so as to suppress ionic conduction in non-aqueous electrolyte solutions, thereby stopping the progress of electrochemical reactions.

In general, it is known that if a shutdown temperature is low, the safety of lithium ion secondary batteries is high. One reason why polyethylene is used as a component of separators is that polyethylene has a moderate shutdown temperature. As such, separators, for example, uniaxially or biaxially stretched resin films, are used to porosify the separators and increase the strength thereof.

In recent years, demand for high capacity and high output secondary cells to improve the thermal stability of separators has increased. Lithium ion secondary batteries require high thermal stability in order to improve safety and increase capacity and output in a manufacturing process thereof and in use.

For example, when the thermal stability of separators decreases, interelectrode short circuits, due to damage or deformation of the separators caused by a temperature rise in the lithium ion secondary batteries, may occur, resulting in the overheating thereof or an increase in the risk of fire, due to membranes themselves being shrunk at general shutdown temperatures, so that anodes and cathodes may come into contact with each other. As a result, a secondary problem such as an internal short circuit may occur. Thus, there is a need to improve the safety of lithium ion secondary batteries by reducing the thermal contraction of separators by increasing the heat resistance properties of the separators.

For example, Japanese Patent Publication No. 2009-16279 discloses a separator having a coating layer in which microframeworks of a polyolefin-based resin material are coated on a glass layer. Japanese Patent No. 3797729 also discloses a separator for a battery in which an inorganic thin film is formed on the surface of a porous polyolefin film by a sol-gel process without charging empty pores.

SUMMARY

An aspect of the present disclosure may provide a separator having excellent shutdown properties, as well as excellent heat resistance properties, while preventing a membrane thereof from being shrunk, and a manufacturing method thereof.

According to an aspect of the present disclosure, a separator for a secondary cell may include: a porous polymer substrate having a first surface, a second surface opposing the first surface, and a plurality of pores connecting the first surface to the second surface; and heat-resistant coating layers formed on at least one of the first surface and the second surface of the porous polymer substrate and on internal surfaces of the pores using an atomic layer deposition (ALD) process, in which pores having a non-coated region are present in the internal surfaces of the pores.

A weight percentage of the heat-resistant coating layers may be within a range of 10% to 50%, based on a total weight percentage of heat-resistant coating layers coated on the first surface and the second surface of the porous polymer substrate and onto the internal surfaces of the pores at the same thickness as an average thickness (d) of the heat-resistant coating layers formed on the first surface and the second surface of the porous polymer substrate.

According to another aspect of the present disclosure, a separator for a secondary cell may include: a porous polymer substrate having a first surface, a second surface opposing the first surface, and a plurality of pores connecting the first surface to the second surface; and heat-resistant coating layers formed on at least one of the first surface and the second surface of the porous polymer substrate and on internal surfaces of the pores using an atomic layer deposition process, in which, with respect to a Gurley value of the separator, an increase in a Gurley value of the separator after the separator remains at 150° C. for one hour may be 200% or greater.

The separator may have a shrinkage of 5% or less before and after remaining at 150° C. for one hour.

The separator may have a melt fracture temperature of 160° C. or higher, measured by thermo-mechanical analysis (TMA).

The separator may include pores, including a region having the heat-resistant coating layers formed therein and a region having non-heat-resistant coating layers formed therein, in the internal surfaces of the pores.

The heat-resistant coating layers formed on the internal surfaces of the pores may have a thickness of 70% or lower, based on a thickness of the heat-resistant coating layers formed on the first surface and the second surface of the porous polymer substrate.

The porous polymer substrate may be formed of a polyolefin-based resin.

The heat-resistant inorganic layers may include a molecule, including an atom of at least one of aluminum, calcium, magnesium, silicon, titanium, and zirconium, and an atom of at least one of carbon, nitrogen, sulfur, and oxygen. The heat-resistant coating layers may be formed of at least one of aluminum oxide, silicon oxide, titanium oxide, and zinc oxide.

According to another aspect of the present disclosure, a method of manufacturing a separator for a secondary cell, the method may include: forming heat-resistant coating layers by repeating cycles of an atomic layer deposition process for a porous polymer substrate having a first surface, a second surface opposing the first surface, and a plurality of pores connecting the first surface to the second surface, each of the cycles of the atomic layer deposition process including: forming a metal compound layer containing a metal by allowing metal compound vapor including at least one of aluminum, calcium, magnesium, silicon, titanium, and zirconium to react with the first surface and the second surface of the porous polymer substrate; forming a solid ceramic layer containing a nonmetal and a metal by allowing nonmetal compound vapor, including at least one of carbon, nitrogen, sulfur, and oxygen, to react with a metal compound contained in the formed metal compound layer; and forming a layer containing a metal on a portion of internal surfaces of the pores by controlling an amount of the metal compound vapor supplied to an entirety of a reaction area of the porous polymer substrate during the forming of the metal compound layer and the forming of the solid ceramic layer, in each of the cycles of the atomic layer deposition process.

The layer containing the metal may be formed on the portion of the internal surfaces of the pores by additionally controlling the number of repetitions of the cycles of the atomic layer deposition process and a reaction time required for the forming of the metal compound layer.

The metal compound vapor may be formed of at least one of $AlCl_3$, tri-methyl-aluminum, $Al(CH_3)_2Cl$, $Al(C_2H_5)_3$, $Al(OC_2H_5)_3$, $Al(N(C_2H_5)_2)_3$, $Al(N(CH_3)_2)_3$, $SiCl_4$, $SiCl_2H_2$, $Si_2Cl_6$, $Si(C_2H_5)H_2$, $Si_2H_6$, $TiF_4$, $TiCl_4$, $TiI_4$, $Ti(OCH_3)_4$, $Ti(OC_2H_5)_4$, $Ti(N(CH_3)_2)_4$, $Ti(N(C_2H_5)_2)_4$, $Ti(N(CH_3)(C_2H_5))_4$, $VOCl_3$, $Zn$, $ZnCl_2$, $Zn(CH_3)_2$, $Zn(C_2H_5)_2$, $ZnI_2$, $ZrCl_4$, $ZrI_4$, $Zr(N(CH_3)_2)_4$, $Zr(N(C_2H_5)_2)_4$, $Zr(N(CH_3)(C_2H_5))_4$, $HfCl_4$, $HfI_4$, $Hf(NO_3)_4$, $Hf(N(CH_3)(C_2H_5))_4$, $Hf(N(CH_3)_2)_4$, $Hf(N(C_2H_5)_2)_4$, $TaCl_5$, $TaF_5$, $TaI_5$, $Ta(O(C_2H_5))_5$, $Ta(N(CH_3)_2)_5$, $Ta(N(C_2H_5)_2)_5$, and $TaBr_5$.

After a preprocessing process of forming a functional group in the porous polymer substrate is conducted, the cycles of the atomic layer deposition process may be performed.

The functional group may be formed on the portion of the internal surfaces of the pores. The functional group may be formed by allowing at least one of water, oxygen, ozone, hydrogen, hydrogen peroxide, alcohol, $NO_2$, $N_2O$, $NH_3$, $N_2$, $N_2H_4$, $C_2H_4$, $HCOOH$, $CH_3COOH$, $H_2S$, $(C_2H_5)_2S_2$, and $CO_2$ to react with the portion of the internal surfaces of the pores, using a plasma treatment, a corona discharge treatment, an ultraviolet ray (UV) irradiation treatment, or an ozone treatment.

The preprocessing process may be performed preferably by adjusting at least one of processing strength, processing time, and the number of times the preprocessing process is repeated.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
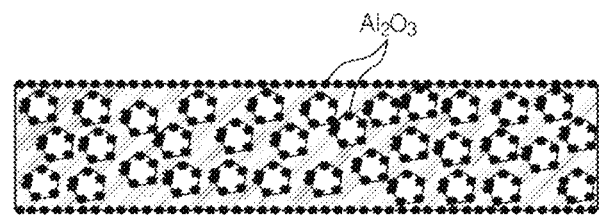
FIG. 1 is a schematic view of a heat-resistant coating layer formed on a portion of internal surfaces of pores, as a cross-sectional view of a separator, according to an embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween that may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to (an)other element(s) shown in the figures. It will be understood that the spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone or as a combination thereof.

The contents of the present disclosure described below may have a variety of configurations, and only a required configuration is proposed herein, but the present disclosure is not limited thereto.

Embodiments of the present disclosure may provide a separator for a secondary cell, which may be manufactured by forming a heat-resistant coating layer on a surface of a porous polymer substrate, using an atomic layer deposition (ALD) process. When a heat-resistant coating layer is formed on a portion of internal surfaces of pores included in the porous polymer substrate, shutdown properties may be provided to the separator, and the separator may be prevented from shrinking, thereby improving safety of the secondary cell.

The separator, according to an embodiment, may allow an anode and a cathode to be separated from each other, thereby preventing short circuits due to a contact therebetween from occurring, and may function to pass lithium ions. The separator may use a substrate formed of a heat-resistant, microporous substance having excellent strength. The substrate may be suitably used in an embodiment, as long as it is a porous polymer substrate, having a first surface, a second surface opposing the first surface, and a plurality of pores connecting the first surface to the second surface.

More preferably, the substrate may be a typical insulating resin material, having a high degree of ion transmittance properties and mechanical strength. Such a resin material may be, for example, a polyolefin-based synthetic resin such as polypropylene (PP) or polyethylene (PE), an acrylic resin, a styrene resin, a polyester resin, or a polyamide-based resin. Such a porous polyolefin membrane may have excellent electrical insulating properties and ion transmitting properties, and may thus be widely used as a separator for a secondary cell or condenser.

The porous polymer substrate as a porous polyolefin substrate may be used without limitation as long as it has a high degree of porosity and allows lithium ions to move between the anode and the cathode. Such a porous polymer substrate is commonly used in the related art, may include a porous polyolefin substrate, mostly represented by polyethylene or polypropylene, and may be formed of other various materials.

The porous polymer substrate may be, for example, polyethylene, such as high-density polyethylene (HDPE), low-density polyethylene (LDPE), linear low-density polyethylene, or high molecular polyethylene, polypropylene, polypropyleneterephthalate, polyethyleneterephthalate, polybutyleneterephthalate, polyester, polyacetal, polyamide, polycarbonate, polyimide, polyamidimide, polyetherimide, polyetheretherketone, polyethersulfone, polyphenyleneoxide, polyphenylenesulfide, or polyethylenenaphthalate. However, the porous polymer substrate is not limited thereto.

Since the secondary cell has a high output density and a high capacity density, but includes a non-aqueous electrolyte solution, for example, an organic solvent, the non-aqueous electrolyte solution may be decomposed by heat generated in an abnormal state of the secondary cell, such as short circuits or overcharging, and in the worst case, may ignite.

In order to prevent such a phenomenon, a shutdown function may be required in the case when the pores have become occluded by the thermally molten resin material, which has been brought to a temperature near the melting point of the secondary cell, when the second cell generates an abnormal amount of heat, all of which results in breaking current flow. In general, if a shutdown temperature is low, the safety of the second cell is high, and because the polyolefin-based resin material as described above has a moderate shutdown temperature, it may thus be suitably used as the separator for the second cell. Also, use of the porous polyolefin membrane may allow separation properties between the anode and the cathode to be excellent, thus further reducing the number of internal short circuits or a level of an open circuit voltage.

In particular, a polyolefin-based resin material such as polyethylene (HDPE or LDPE), or linear polyethylene, or polypropylene may be more preferable, in terms of a melting temperature. Such a separator, for example, a uniaxially or biaxially stretched resin film, may be used to porosify the separator and increase strength thereof. Further, a structure having two types of porous membranes stacked on each other, or a porous membrane formed of two types of molten resin materials and mixed with each other, may be used.

A thickness of the substrate may be randomly set, but is not particularly limited to, a thickness or greater at which the separator may maintain a required level of strength, and for example, may be within a range from 5 μm to 80 μm, and preferably 7 μm to 30 μm. The substrate may have a thickness within the above-described range, thereby insulating the anode from the cathode, preventing short circuits or the like, providing ion transmitting properties to the separator so that a suitable secondary cell reaction can be performed through the separator, and increasing volume efficiency of an active material layer, which contributes to the secondary cell reaction occurring as efficiently as possible.

A degree of porosity of the porous polymer substrate is not particularly limited, and may be, for example, within a range from 10% to 80%, and more preferably, 40% to 70%. In an embodiment, the size of the pores of the porous polymer substrate may be, for example, within a range from 10 nm to 2,000 nm, and more preferably 10 nm to 1,000 nm.

The above-mentioned polyolefin-based resin material may be preferable in terms of the shutdown function, but when the secondary cell is shut down, the separator may shrink, so that the anode and the cathode come into contact with each other. As a result, a secondary problem such as internal short circuits may occur. Thus, the separator formed of the polyolefin-based resin material may require an increase of heat resistance properties, to reduce thermal contraction, thereby improving safety. Further, the heat-resistant coating layer may preferably have a function of increasing wettability with the non-aqueous electrolyte solution.

According to an embodiment, the substrate formed of the polyolefin-based resin material may have the heat-resistant coating layer formed thereon, in order to prevent the separator from shrinking, by increasing the heat resistance properties of the substrate. The heat-resistant coating layer may preferably be formed of an inorganic material having greater heat resistance properties than a material forming the substrate.

Such an inorganic material may include, for example, a molecule including an atom of at least one of aluminum, calcium, magnesium, silicon, titanium, and zirconium, and an atom of at least one of carbon, nitrogen, sulfur, and oxygen. More preferably, an aluminum oxide, a silicon oxide, a titanium oxide, or a zinc oxide may be used.

An inorganic oxide formed by the ALD process and having a nanoscale thickness may be, for example, a tantalum oxide, a tantalum nitride, a zirconium oxide, a silicon oxide, a silicon nitride, a silicon carbide, a vanadium oxide, a zinc oxide, a zinc sulfide, an aluminum oxide, an aluminum hydroxide, an aluminum nitride, a titanium oxide, a titanium nitride, a hafnium oxide, or a hafnium nitride, which may be used alone, or in combinations thereof, but is not limited thereto.

The heat-resistant coating layer may preferably be formed on the surface of the substrate, for example, on one or both surfaces thereof, as well as on the internal surfaces of the pores included in the substrate. The heat-resistant coating layer may prevent the separator from shrinking in an abnormal high-temperature environment by being formed on the surface of the substrate. Further, the heat-resistant coating layer may be formed on the internal surfaces of the pores, thereby further increasing the heat resistance properties of the separator, as compared to the case where the heat-resistant coating layer is formed only on the surface of the substrate. Also, the heat-resistant coating layer, having good wettability with the non-aqueous electrolyte solution, may preferably be formed on the internal surfaces of the pores to further increase the affinity of the non-aqueous electrolyte solution for the pores.

According to an embodiment, the heat-resistant coating layer formed on the internal surfaces of the pores may preferably be formed on a portion of the internal surfaces of the pores. The polyolefin-based resin material may be used to improve the safety of the secondary cell by implementing the shutdown function of blocking current flow, occluding the pores by bringing the microporous substance of the separator to a thermally molten state, near the melting point of the polyolefin-based resin material, when the secondary cell generates an abnormal amount of heat. However, when the heat-resistant coating layer is formed on the entirety of the internal surfaces of the pores, the heat-resistant coating layer may cause the occlusion of the pores by thermal melting to be degraded, thereby significantly degrading the shutdown function. In this way, the advantage of using the polyolefin-based resin may be reduced.

According to an embodiment, when the portion of the internal surfaces of the pores is coated with the heat-resistant coating layer, for example, in the case where a coated region, in which the heat-resistant coating layer is formed, and a non-coated region, in which the heat-resistant coating layer is not formed, coexist, it may be preferable that the shutdown function be performed by occluding the pores by the melting of the resin material under the abnormal high-temperature environment due to the presence of the non-coated region, while preventing the separator from shrinking and increasing the affinity of the non-aqueous electrolyte solution.

Such an effect consists of forming the heat-resistant coating layer on the surface of the substrate, as well as on the portion of the internal surfaces of the pores, and forming a network structure between portions of the heat-resistant coating layer formed on the portion of the internal surfaces of the pores to increase retention strength of a porous structure of the substrate at high temperatures, thereby preventing the separator from shrinking at high temperatures and triggering the shutdown function.

A cross-sectional structure of the separator having the heat-resistant coating layer, according to an embodiment as described above, is illustrated in FIG. 1. FIG. 1 is an exaggerated view to promote easy understanding of the concept of the present disclosure, and is not limited to a structure illustrated in the drawings.

Further, FIG. 1 illustrates the respective pores when disconnected from each other, but it may be understood by those skilled in the art that the pores may connect the first surface of the substrate to the second surface opposing the first surface, while the pores may also be connected to each other.

Also, all of the pores of the substrate are not limited to having both the coated region and the non-coated region that coexist in all of the pores included in the substrate; only the non-coated region may be present in the portion of the pores, and only the coated region may also be present in the portion of the pores.

The heat-resistant coating layer may preferably be formed on the substrate, using the ALD process. The forming of the heat-resistant coating layer using the ALD process may allow the heat-resistant coating layer to be formed on the internal surfaces of the pores, as well as on the surface of the substrate, and appropriate control of conditions of the ALD process may allow the heat-resistant coating layer to be formed on the portion of the internal surfaces of the pores. Hereinafter, a method of forming the heat-resistant coating layer using the ALD process will be described in more detail.

The method, according to an embodiment, may improve heat resistance and shutdown properties by forming an inorganic film on the portion of the internal surfaces of the pores included in the porous polymer substrate. A separator having the inorganic film formed on the portion of the internal surfaces of the pores may have a lower thermal stability than that of an inorganic deposition separator having a metal compound coated thereon, but the inorganic deposition separator may have low shutdown properties, and thus safety of the inorganic deposition separator may decrease.

However, the separator, according to an embodiment, may have the inorganic film formed on the portion of the internal surfaces of the pores included in the porous polymer substrate, and the inorganic film may form the network structure. Accordingly, the inorganic film and the network structure may maintain an overall structure of the separator even when thermal energy is injected thereinto, thereby avoiding thermal contraction and improving heat resistance properties while preventing shutdown properties from being decreased.

As a result, a separator having excellent heat resistance and shutdown properties may be formed.

A general ALD process is widely known as a process of applying a specific material to an internal surface of a substrate having a high aspect ratio. Because the general ALD process may allow the specific material to react with a surface of a structure having pores of a microscale or nanoscale size, the general ALD process has been applied to a microchannel plate, nanoparticles, nanopores, aerogel, a nanotube membrane, or a microlattice.

In general, the ALD process may have process conditions designed to stimulate a self-limiting reaction. An ideal ALD process may be performed by saturating amounts of a precursor and a reactant in each injection operation and completely purging the precursor and the reactant in a purge operation; thus, the surface and the internal surface of the substrate may have the same thickness as the heat-resistant coating layer. By using such characteristics of the ALD process, unlike a chemical or thermal deposition process, the inorganic film may be formed on the internal surfaces of the pores.

A method, according to an embodiment, may provide a shutdown function, using a region of the pores, in which the inorganic film is not formed, while maintaining the characteristics of the ALD process. The inorganic film may be formed on the portion of the internal surfaces of the pores by modifying the formation of a functional group on the substrate. The inorganic film may be coated using two methods. First, the amount of the functional group applied to the substrate before the coating of the inorganic film may be adjusted, so that the inorganic film may not be formed on the portion of the internal surfaces of the pores. In order to adjust the application of a reactable functional group to the surface of the substrate and the internal surfaces of the pores, a preprocessing process and the strength of the substrate may be controlled.

Examples of the preprocessing process may include a plasma treatment allowing the surface of the porous polymer substrate to be treated with plasma, including a gas such as oxygen, water, or nitrogen; a surface treatment allowing the surface of the porous polymer substrate to be treated with an organic compound monomer made into plasma, a corona discharge treatment, an ultraviolet (UV) irradiation treatment; or an ozone treatment performed on the surface of the porous polymer substrate before forming an ALD layer. These treatments may be further beneficial in increasing adhesion of the ALD layer on the surface of the porous polymer substrate, and in particular, may allow the functional group to be increased in density, thereby forming a metal compound layer having a high density and excellent morphology. In an embodiment, depending on processing strength and a processing time, an amount of the functional group may be adjusted.

Further, in the case where the metal compound is applied to the porous polymer substrate using the ALD process, when a metal precursor is stacked on the porous polymer substrate, an aspect of formation of the inorganic film may vary, depending on an amount of the metal precursor supplied to a reaction area and an amount of the reactable functional group formed on the surface of the porous polymer substrate.

According to an embodiment, with respect to the porous polymer substrate having the first surface, the second surface opposing the first surface, and the pores connecting the first surface to the second surface, a functional group such as a hydroxy group may be formed on the first and second surfaces and on the internal surfaces of the pores.

Examples of the reactant used in an embodiment may be at least one of water, oxygen, ozone, hydrogen peroxide, alcohol, $NO_2$, $N_2O$, $NH_3$, $N_2$, $N_2H_4$, $C_2H_4$, HCOOH, $CH_3COOH$, $H_2S$, $(C_2H_5)_2S_2$, $N_2O$ plasma, hydrogen plasma, oxygen plasma, $CO_2$ plasma, and $NH_3$ plasma, but are not limited thereto.

In an embodiment, a plasma treatment allowing the surface of the porous polymer substrate to be treated with plasma including a gas such as oxygen, water, or nitrogen, a surface treatment allowing the surface of the porous polymer substrate to be treated with an organic compound monomer made into plasma, a corona discharge treatment, an UV irradiation treatment, or an ozone treatment, may be performed on the surface of the porous polymer substrate before forming an ALD layer. These treatments may be further help with the adhesion of the ALD layer on the surface of the porous polymer substrate, and in particular, may allow the amount of the functional group, formed on the surface of the porous polymer substrate, to be adjusted, thereby forming a metal compound layer having excellent morphology.

In an embodiment, the amount of the functional group formed on the surface of the substrate may be adjusted to control the distribution of the functional group, and thus an aspect of formation of the heat-resistant coating layer may vary. The amount of the functional group may be adjusted by controlling the above-mentioned processing strength and processing time.

For example, when a plasma treatment is performed, an amount of a heat-resistant coating layer formed on a substrate may be adjusted by changing plasma conditions, and in an embodiment, the substrate may be treated as follows.

The substrate may be plasma treated by injecting a gas with a power of 0.01 kW to 5.0 kW, at a rate of 1 m/min to 60 m/min, at an $N_2$ flow rate of 400 slm, and at a CDA flow rate of 0.4 sim, using in-line AP plasma.

In general, a gas or compound used for a polymer film may include nitrogen (N), argon (Ar), oxygen ($O_2$), helium (He), nitrous acid, water vapor, carbon dioxide ($CO_2$), methane ($CH_4$), or ammonia ($NH_3$). Depending on the power and the rate, a degree of hydrophilization of the substrate may be adjusted. That is, a change in a hydrophilic functional group according to the plasma treatment may allow surface tension of the substrate to vary. For example, when a polyethylene (PE) substrate for a separator having a surface tension of 41 dyne is subjected to an AP plasma treatment at a power of 1.44 kW at a rate of 5 m/min, a degree of hydrophilization of the PE substrate may rise to 47 dyne, and when the PE substrate is subjected to an AP plasma treatment at a power of 1.68 kW at a rate of 3 m/min, a degree of hydrophilization of the PE substrate may rise to 48 dyne. In addition, a surface treatment method, such as a corona treatment or an ozone treatment, may allow the surface of the PE substrate to be reformed.

The porous polymer substrate having the functional group applied thereto may be positioned on a reactive chamber, and the metal precursor including a metal may be applied to the respective surfaces of the porous polymer substrate under a vacuum atmosphere, so that the metal precursor may contact the respective surfaces.

The heat-resistant coating layer may include a molecule including an atom of at least one of aluminum, calcium, magnesium, silicon, titanium, vanadium, zinc, tantalum, hafnium, and zirconium, and an atom of at least one of carbon, nitrogen, sulfur, and oxygen, and more preferably, at least one of an aluminum oxide, a silicon oxide, a titanium oxide, and a zinc oxide.

Examples of the metal precursor used in an embodiment may include at least one of $AlCl_3$, tri-methyl-aluminum (TMA), $Al(CH_3)_2Cl$, $Al(C_2H_5)_3$, $Al(OC_2H_5)_3$, $Al(N(C_2H_5)_2)_3$, $Al(N(CH_3)_2)_3$, $SiCl_4$, $SiCl_2H_2$, $Si_2Cl_6$, $Si(C_2H_5)H_2$, $Si_2He$, $TiF_4$, $TiCl_4$, $TiI_4$, $Ti(OCH_3)_4$, $Ti(OC_2H_5)_4$, $Ti(N(CH_3)_2)_4$, $Ti(N(C_2H_5)_2)_4$, $Ti(N(CH_3)(C_2H_5))_4$, $VOCl_3$, $Zn$, $ZnCl_2$, $Zn(CH_3)_2$, $Zn(C_2H_5)_2$, $ZnI_2$, $ZrCl_4$, $ZrI_4$, $Zr(N(CH_3)_2)_4$, $Zr(N(C_2H_5)_2)_4$, $Zr(N(CH_3)(C_2H_5))_4$, $HfCl_4$, $HfI_4$, $Hf(NO_3)_4$, $Hf(N(CH_3)(C_2H_5))_4$, $Hf(N(CH_3)_2)_4$, $Hf(N(C_2H_5)_2)_4$, $TaCl_5$, $TaF_5$, $TaI_5$, $Ta(O(C_2H_5))_5$, $Ta(N(CH_3)_2)_5$, $Ta(N(C_2H_5)_2)_5$, and $TaBr_5$.

After the metal precursor reacts with the surface of the porous polymer substrate, the surface of the porous polymer substrate may be purged with a non-reactive gas such as argon (Ar), and the reactant, including at least one of carbon, nitrogen, sulfur, and oxygen, may be applied to the surface of the porous polymer substrate so as to contact the reacted metal precursor.

Subsequently, the surface of the porous polymer substrate may be purged with a non-reactive gas to form the heat-resistant coating layer. In the forming of the heat-resistant coating layer formed of a solid ceramic layer including a nonmetal and a metal, the heat-resistant coating layer may be formed to have a certain thickness by repeating the application of the metal precursor to the solid ceramic layer, the purging of the surface of the porous polymer substrate, the applying of the reactant, and the purging of the surface of the porous polymer substrate. In the case where the metal compound is applied to the porous polymer substrate using the ALD process, when the metal precursor is stacked on the porous polymer substrate, the formation of the inorganic film may vary, depending on an amount of the metal precursor supplied to the reaction area.

In an embodiment, control of the preprocessing may allow the heat-resistant coating layer to be formed on the portion of the internal surfaces of the pores, and control of a degree of the self-limiting reaction through control of the processing time and the processing conditions of a cycle of the ALD process may also allow the heat-resistant coating layer to be formed on the portion of the internal surfaces of the pores. Second, the inorganic film may be coated by adjusting the process conditions until the reactant reaches a saturated state for the self-limiting reaction.

In the ALD process, first, a deposition process may be required to include a series of separate processes. In the case where two reactions are not separated from each other but are mixed with each other, a gas-phase reaction may occur. Second, a reaction between the reactant and the surface may be required to be performed by a self-limiting reaction. Third, the self-limiting reaction or chemical adsorption may be required to be a primary reaction.

Figure 2:
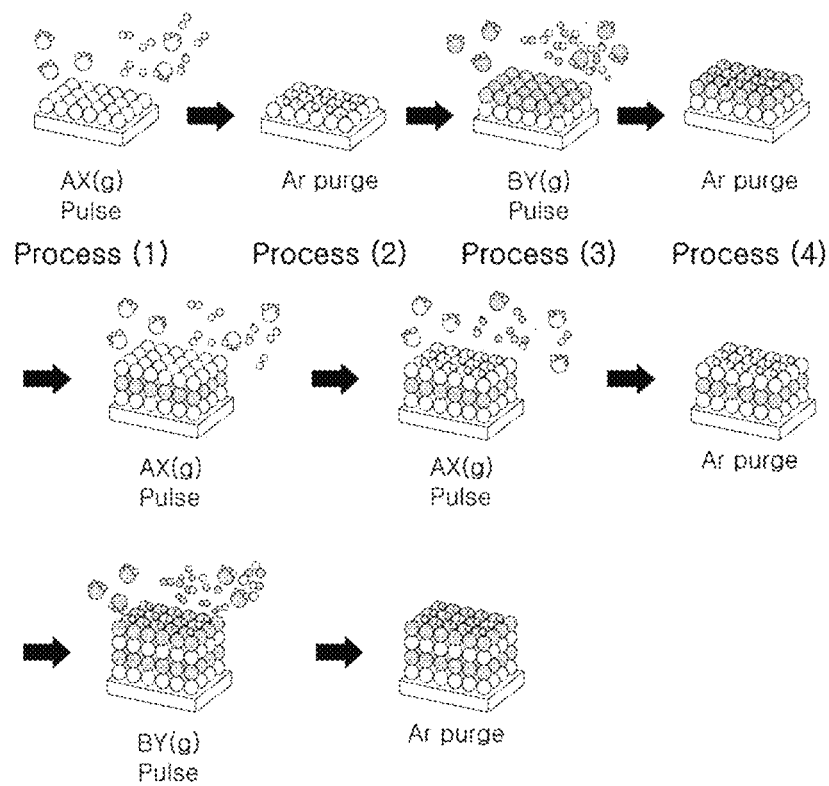
FIG. 2 is a set of schematic views of the process of forming a heat-resistant coating layer, according to an embodiment, using an atomic layer deposition (ALD) process.

The concept of the process of forming the heat-resistant coating layer using the ALD process, according to an embodiment, will be illustrated in FIG. 2. As illustrated in FIG. 2, when a reaction A is supplied to the substrate, the reaction A may react with the surface of the substrate to be chemically adsorbed thereonto. When the reaction A is deposited on the surface of the substrate as an atomic layer, even in a case in which a gas formed of an excessive amount of the reaction A is supplied to the surface of the substrate, the gas may no longer react with the surface of the substrate (a self-limiting reaction)(Process 1).

Next, when the reaction A no longer reacts with the surface of the substrate, the surface of the substrate may be purged with an inert gas such as argon (Ar), and thus the excessive amount of the reaction A may be removed externally from the functional group (Process 2).

Subsequently, when the reaction A is completely removed from the functional group, a reactant B may be supplied to the surface of the substrate, and may then react with the reaction A adsorbed onto the surface of the substrate, to be chemically adsorbed thereonto. When the reaction B is saturated on the surface of the substrate, the reaction B may no longer react with the surface of the substrate (a self-limiting reaction) (Process 3).

Further, when the reaction B no longer reacts with the surface of the substrate, the surface of the substrate may be purged with an inert gas, and thus an excessive amount of the reaction B may be removed externally from the functional group (Process 4).

Processes 1 to 4 may form a single cycle, and such a single cycle may be repeated to grow a thin atomic layer having a desired thickness. As a method of depositing the thin atomic layer using the adsorption between the precursor and the reactant and the surface reaction between their adsorbed molecules, an example of using a precursor such as $Al(CH_3)_3$ and $H_2O$, having a half-reaction below, is illustrated in FIGS. 3 and 4.

Figure 3:
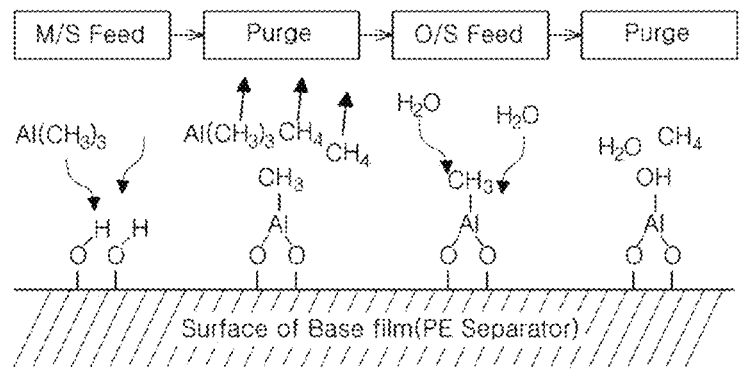
FIGS. 3 and 4 are schematic views of depositing a thin film with a precursor such as $Al(CH_3)_3$ and $H_2O$ having a half-reaction, using adsorption of the precursor and a reactant and a surface reaction between their adsorbed molecules.
Figure 4:
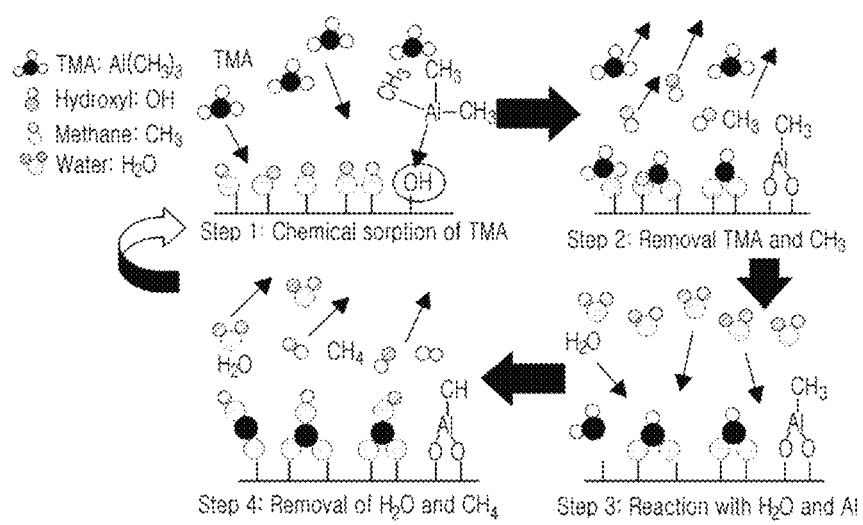

As illustrated in FIGS. 3 and 4, a precursor such as $Al(CH_3)_3$ may be supplied in vapor phase to the surface of the substrate having the hydroxy group as a functional group, so that aluminum (Al) may be adsorbed onto the surface of the substrate, as represented by the following Reaction Formula (A) below. The inert gas may be supplied to a reaction gas to purge the surface of the substrate, thereby separating two half-reactions. In an embodiment, except for chemically adsorbed molecules, physically adsorbed molecules may be removed, a reactant may be injected, and thus a half-reaction, represented by the following Reaction Formula (B, may be performed. A reaction gas may be supplied to the surface of the substrate so as to be adsorbed onto or bonded to the molecules adsorbed in Reaction (A), thereby forming the thin atomic layer.

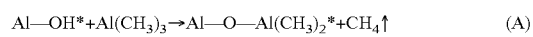

$$Al—OH^* + Al(CH_3)_3 \rightarrow Al—O—Al(CH_3)_2^* + CH_4 \uparrow \quad (A)$$

$$Al—CH_3^* + H_2O \rightarrow Al—OH^* + CH_4 \uparrow \quad (B)$$

**(A): OH terminated, (B): $CH_3$ terminated surface

In this manner, the heat-resistant coating layer may be formed by repeating the adsorption reaction of the reaction A as an OH terminated chemical species and the adsorption and bonding reactions of the reaction B as a $CH_3$ terminated chemical species as a single cycle of reaction.

General factors influencing the ALD process are as follows.

A flow direction of the reactant relates to equipment used in the ALD process, and a reactor used as a type of ALD equipment may be a shower head type or a laminar flow type. The shower head type may have excellent uniformity of the flow direction of the reactant due to a wide reaction area, but may require a long purge time. The laminar flow type may minimize reaction volume, may increase use efficiency of a precursor and a functional group, thereby enabling an effective reaction, but may decrease uniformity of the flow direction of the reactant due to reduction in use efficiency of the precursor and the functional group when the reactant flows from an inlet to an outlet of the reactor. More specifically, when the flow direction of the reactant is the same as flow directions of the pores, it may be effective in the reaction. Thus, it may be preferable to use a shower head type of reactor, in which the overall flow direction of the reactant is the same as the direction of the pores. In particular, use of a substrate having a pore structure with a high aspect ratio may allow a mean free path to be improved when the shower head type of reactor is used, as the overall flow direction of the reactant is the same as the flow directions of the pores, which may be further beneficial in forming the inorganic film and in coating the portion of the internal surfaces of the pores therewith.

A flux of the reactant may be adjusted according to a flow type of the reactant, and supplying a larger amount of a carrier gas for injecting the precursor and the reactant may be effective in the reaction. However, it may be preferable that an amount of the carrier gas be adjusted according to an aspect ratio of the substrate. Further, it may be required that supply of a certain amount or more of the carrier gas be adjusted according to the volume of a chamber. A commonly used carrier gas may include an inert gas, but is not limited thereto, and may also include argon (Ar) or nitrogen (N).

In the ALD reaction, a process temperature may be dependent, most importantly, on a reaction temperature of the precursor. The process temperature may be determined to be within a window of the precursor, and may also be determined according to a temperature rise range of the substrate. That is, it may be preferable that the ALD reaction be performed at the highest temperature possible, considering a temperature range in which damage to the substrate may be avoided and a reaction temperature range of the precursor. For example, in the ALD reaction, the process temperature may be properly selected within a range from 25° C. to 400° C., in which range the process temperature may not influence the substrate.

A degree of a vacuum within the chamber may be generally within a range from a torr of $7.6 \times 10^{-11}$ of an ultra high vacuum level to several torrs, which can be provided by a first pump, for example, a rough pump, and may be determined to be within a vacuum condition of several torr or higher. Injection pressure of the precursor and the reactant may be increased as the degree of the vacuum becomes higher, and it may be preferable that the precursor and the reactant are injected at a higher degree of the vacuum. In particular, in the case of a porous substrate, the degree of a vacuum thereof may have an influence on the mean free path.

Injection and purge times of the precursor and the reactant may be factors that can adjust the thickness of the thin atomic layer more directly. It may be required to supply a material for a sufficiently long period of time, and when the purge time is insufficient, a chemical vapor deposition (CVD) effect may cause uniformity of the thickness of the thin atomic layer to decrease. Thus, the injection time may range from 0.1 second to 10 seconds, and the purge time may increase in proportion to the injection time, and may range from 1 second to 30 seconds.

A degree of the self-limiting reaction in Processes 1 and 3 may be controlled, and the supply and retention of the precursor and the reactant for the control of the self-limiting reaction may be controlled, depending on the flow of flux, the purge direction, the injection pressure of the precursor and the reactant, the concentrations and injection amounts of the precursor and the reactant, the retention times of the precursor and the reactant on the substrate, the aspect ratio of the substrate, and the process temperature, thereby obtaining a membrane portion and a non-membrane portion. Accordingly, a separator for a secondary cell may be manufactured by adjusting the shape of the membrane portion of the inorganic film, while applying the ability to cover a high aspect ratio of the substrate that characterizes the ALD process.

The separator, manufactured according to an embodiment, may have the heat-resistant coating layer formed on the portion of the internal surfaces of the pores included in the porous polymer substrate, may have a lower thermal stability than that of the inorganic deposition separator having the metal compound coated on the entirety of the pores, but the inorganic deposition separator may have low shutdown properties, thereby reducing safety. Because the separator, having the network structure formed of the inorganic film formed on the portion of the internal surfaces of the pores, may maintain the overall structure of the separator even when thermal energy is injected thereinto, thereby avoiding thermal contraction, while preventing shutdown properties from decreasing. As a result, the separator having excellent heat resistance and shutdown properties may be formed.

With respect to the separator having the heat-resistant coating layer formed on the portion of the internal surfaces of the pores, an average thickness t of the inorganic film formed on the surface of the porous polymer substrate may be measured using an SEM, and the weight of the inorganic film may be measured before and after the ALD process, thereby obtaining the deposition weight of the inorganic film. Accordingly, it can be seen that the heat-resistant coating layer is formed on the portion of the internal surfaces of the pores.

The average pore diameter R and thickness of the substrate may be measured, and the porosity P thereof may be calculated, by the following Formula 1.

$$\text{Porosity} = \{(A \times B \times T) - (M \div \rho_p) \div (A \times B \times T)\} \times 100 \quad \text{[Formula 1]}$$

In Formula 1, T is the thickness of the separator, M is the weight of the substrate, and $\rho_p$ is the density of the resin material.

$$\text{Theoretical deposition weight} = \{P \times \rho_p \times T \times t \times (2R - t)\} / (100 \times R^2) \quad \text{[Formula 2]}$$

In Formula 2, T is the deposition thickness and $\rho_p$ is the density of the resin material.

When the heat-resistant coating layer is formed using the ALD process, the heat-resistant coating layer may be formed on the entirety of the surface of the substrate and of the internal surfaces of the pores. According to an embodiment, the heat-resistant coating layer may be formed on the portion of the internal surfaces of the pores. Thus, the weight of the heat-resistant coating layer formed on the portion of the internal surfaces of the pores may be less than the weight of the heat-resistant coating layer formed on the entirety of the surface of the substrate and of the internal surfaces of the pores. More specifically, the total weight of the heat-resistant coating layer may be within a range from 10% to 50% based on the total weight of the heat-resistant coating layer coated on the first and second surfaces of the porous polymer substrate and onto the internal surfaces of the pores at the same thickness as the average thickness (d) of the heat-resistant coating layers formed on the first and second surfaces of the porous polymer substrate.

In an embodiment, the heat-resistant coating layer formed on the internal surfaces of the pores may have the same thickness as that of the heat-resistant coating layer formed on the surface of the substrate, and may also have a thickness less than that of the heat-resistant coating layer formed on the surface of the substrate. For example, the thickness of the heat-resistant coating layer, formed on the internal surfaces of the pores, may be 70% or less of the thickness of the heat-resistant coating layer formed on the surface of the substrate.

The separator, according to an embodiment as described above, may preferably have a rate of change in a Gurley value equal to 200% or greater than that of the separator before and after high heat resistance properties of the separator are evaluated. More specifically, when a Gurley value of the separator obtained in an embodiment is compared with a Gurley value thereof measured after the separator remains at 150° C. for 1 hour, the Gurley value thereof after the evaluation of the high heat resistance properties may be equal to 200% or greater than the Gurley value of the separator obtained in an embodiment. This may indicate that the shutdown function of occluding the pores by the thermally molten resin material of the separator, when the secondary cell generates an abnormal amount of heat, may be smoothly performed.

The shrinkage of the separator before and after the evaluation of the high heat resistance properties may preferably be a value of 5% or less. That is, even when the resin material is thermally molten in the non-coated region of the pores at a temperature at which the shutdown function is performed to occlude the pores, the membrane portion of the separator may be prevented from shrinking. As a result, internal short circuits due to the contact between the anode and the cathode may be avoided.

Further, the separator may preferably have a melt fracture temperature of 160° C. or higher, measured by thermomechanical analysis (TMA).

EXAMPLES

Hereinafter, Examples 1 to 3 of the present disclosure will be described in more detail. However, Examples 1 to 3 are for illustrative purposes only, and the present disclosure is not limited thereto.

Preparation Example—Manufacturing of Porous Polymer Substrate

In order to manufacture a polyolefin-based microporous layer, high-density polyethylene having an average molecular weight of $3.8 \times 10^5$ was used, a 1:2 mixture of dibutylphthalate and paraffin oil having a kinematic viscosity of 160 cSt at 40° C. was used as a diluent, and the contents of the high-density polyethylene and the diluent were 30 wt % and 70 wt %, respectively.

The resulting composition was extruded at 240° C., using a twin-shaft compounder having a T-die, passed through a section set to 180° C. to cause phase separation, and was manufactured to form a sheet, using a casting roll. The sheet was manufactured by sequential biaxial stretching at a stretching ratio (7.5 times in a machine direction (MD) and a transverse direction (TD), respectively) at a stretching temperature of 131° C. Here, a heat setting temperature was 130° C., and a heat setting width was 1.1-1.3-1.1.

Figure 5:
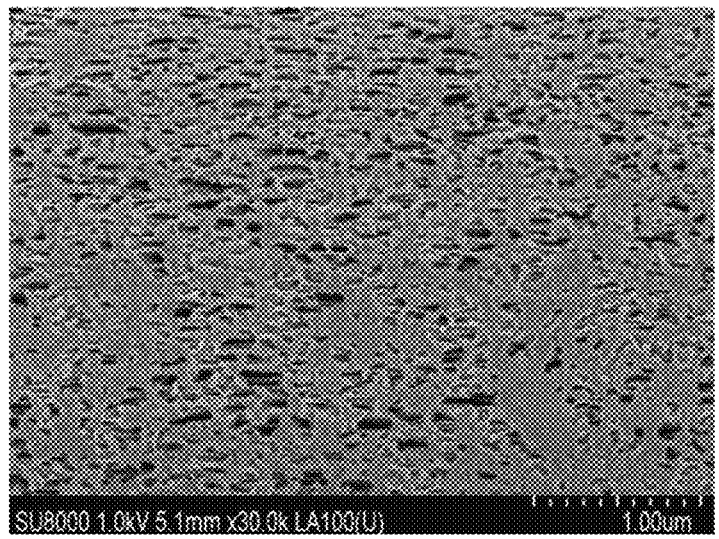
FIG. 5 is a scanning electron microscope (SEM) picture of a surface of a porous polymer substrate manufactured according to a Preparation Example.

An image of a surface of a manufactured porous polymer substrate was captured using an SEM, and the resulting image is illustrated in FIG. 5.

Further, the following physical properties of the porous polymer substrate were measured, and the measured thickness, gas permeability (Gurley value), porosity, and pore size of the porous polymer substrate were 25 µm, 100 seconds, 60%, and 22 nm, respectively. Also, the shrinkage of the porous polymer substrate at 130° C. was 25% and 28% in the MD and the TD, respectively.

Example 1

The porous polymer substrate, manufactured as the Preparation Example, was treated under conditions of a power of 1.9 kW, a slit distance between the porous polymer substrate and plasma of 3 mm, a plasma slit gap of 2 mm, and a line speed of 10 m/min, using in-line oxygen plasma equipment.

The plasma-treated porous polymer substrate was mounted within a chamber set to 100° C. Trimethylaluminum ($Al(CH_3)_3$), argon (Ar), water ($H_2O$), and argon (Ar) were sequentially applied to the surface of the porous polymer substrate at exposure times of 1, 5, 3, and 15 seconds, and this cycle of processes was repeated 92 times to form a metal compound layer, for example, an aluminum oxide ($Al_2O_3$) layer having a density of $2.6$ g/cm$^3$. Detailed process conditions are illustrated in Table 1.

Figure 6:
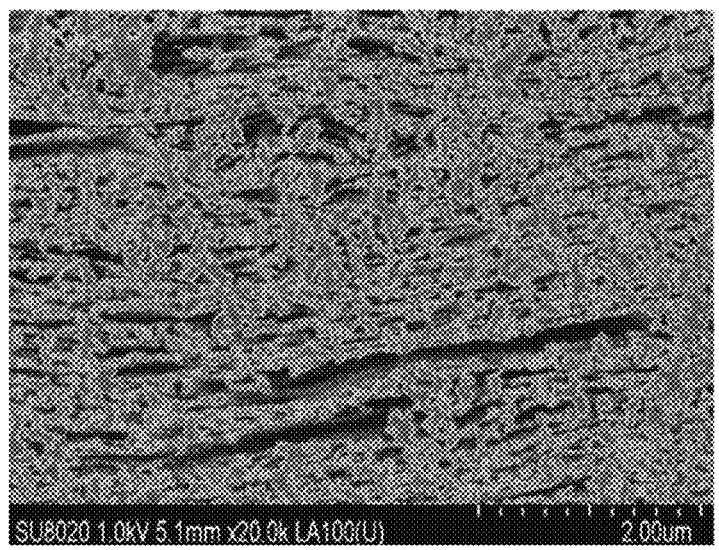
FIG. 6 is an SEM picture of a surface of a separator having a portion coated with an aluminum oxide layer according to Example 1.

An image of the surface of the separator having the aluminum oxide layer formed thereon was captured using the SEM, and the captured image is illustrated in FIG. 6.

Further, the characteristics of the separator having the aluminum oxide layer formed thereon were evaluated, as illustrated in Table 2 below.

Example 2

An aluminum oxide ($Al_2O_3$) layer was formed on a porous polymer substrate by performing an ALD process 60 times, using the same method illustrated in Example 1, except that an application time of trimethylaluminum ($Al(CH_3)_3$) was changed to 3 seconds, and a purge time thereof was changed to 10 seconds, without using a plasma treatment. Detailed process conditions are illustrated in Table 1.

Further, the characteristics of the separator having the aluminum oxide layer formed thereon were evaluated, as illustrated in Table 2 below.

Example 3

The porous polymer substrate, manufactured as the Preparation Example, was treated under conditions of a power of 2.28 kW, a slit distance between the porous polymer substrate and plasma of 3 mm, a plasma slit gap of 2 mm, and a line speed of 3 m/min, using in-line oxygen plasma equipment.

An aluminum oxide ($Al_2O_3$) layer was formed on the plasma-treated porous polymer substrate by performing an ALD process by the same method illustrated in Example 1, except that an application time of trimethylaluminum ($Al(CH_3)_3$) was changed to 5 seconds, a purge time thereof was changed to 10 seconds, and the ALD process was performed 45 times. Detailed process conditions are illustrated in Table 1.

Further, the characteristics of the separator having the aluminum oxide ($Al_2O_3$) layer formed thereon were evaluated, as illustrated in Table 2 below.

Comparative Example 1

The aluminum oxide ($Al_2O_3$) layer was formed on the porous polymer substrate manufactured as the Preparation Example by performing an ALD process by the same method illustrated in Example 1, except that an application time of trimethylaluminum ($Al(CH_3)_3$) was changed to 0.1 second, and the ALD process was performed 150 times. Detailed process conditions are illustrated in Table 1.

Further, the characteristics of the separator having the aluminum oxide ($Al_2O_3$) layer formed thereon were evaluated, as illustrated in Table 2 below.

Comparative Example 2

The porous polymer substrate manufactured as the Preparation Example was treated under a power of 2.28 kW, a slit distance between the porous polymer substrate and plasma of 3 mm, a plasma slit gap of 2 mm, and a line speed of 3 m/min, using in-line oxygen plasma equipment.

An aluminum oxide ($Al_2O_3$) layer was formed on the plasma-treated porous polymer substrate by performing an ALD process by the same method illustrated in Example 1, except that an application time of trimethylaluminum ($Al(CH_3)_3$) was changed to 5 seconds, and the ALD process was performed 50 times. Detailed process conditions are illustrated in Table 1.

Further, the characteristics of the separator having the aluminum oxide ($Al_2O_3$) layer formed thereon were evaluated, as illustrated in Table 2 below.

Comparative Example 3

The porous polymer substrate manufactured as the Preparation Example was treated under conditions of a power of 2.28 kW, a slit distance between the porous polymer substrate and plasma of 3 mm, a plasma slit gap of 2 mm, and a line speed of 3 m/min, using in-line oxygen plasma equipment.

Trimethylaluminum ($Al(CH_3)_3$), argon (Ar), water ($H_2O$), and argon (Ar) were sequentially applied to the surface of the plasma-treated porous polymer sheet at exposure times of 20, 20, 5, and 30 seconds, and this process was repeated 45 times, to form an aluminum oxide ($Al_2O_3$) layer on the plasma-treated porous polymer sheet. Detailed process conditions are illustrated in Table 1.

Further, the characteristics of the separator having the aluminum oxide ($Al_2O_3$) layer formed thereon were evaluated, as illustrated in Table 2 below.

TABLE 2

|  | Examples | | | Comparative Examples | | |
| --- | --- | --- | --- | --- | --- | --- |
|  | 1 | 2 | 3 | 1 | 2 | 3 |
| Gas Permability (sec/100 cc) | 236 | 244.8 | 237.3 | 231.1 | 525.4 | 629.4 |
| Deposition thickness (t, nm) | 14.02 | 9.24 | 4.59 | 20.94 | 4.76 | 3.83 |
| Contraction (%, MD/TD) | 1.0/5.0 | 0.7/4.3 | 1.5/4.3 | 35.3/38.5 | 0.2/2.0 | 0.1/1.0 |
| TMA maximum shrinkage (%) | 1.55 | 2.09 | 3.79 | 34 | 0.36 | 0.32 |
| TMA melt fracture temperature (° C.) | 188.67 | 201.33 | 222 | 192.58 | 219.58 | 221.52 |
| Gas permeability (sec/100 cc) after evaluation of shutdown function | 1026 | 846 | 538 | 302 | 630 | 658 |
| Weight of inorganic film (g/m²) | 3.40 | 5.00 | 6.63 | 1.04 | 8.93 | 23.85 |
| Theoretical weight | 33.87 | 25.88 | 14.58 | 38.91 | 15.05 | 25.02 |
| Actual weight/Theoretical weight × 100 (%) | 10.04 | 19.32 | 45.51 | 2.68 | 59.33 | 95.31 |

TABLE 1

|  | Examples | | | Comparative Examples | | |
| --- | --- | --- | --- | --- | --- | --- |
|  | 1 | 2 | 3 | 1 | 2 | 3 |
| Gas permeability after evaluation of shutdown function (sec/100 cc) | 1026 | 846 | 538 | 302 | 630 | 658 |
| Plasma power | 1.9 kw 10 m/min | x | 2.28 kw 3 m/min | x | 2.28 kw 3 m/min | 2.28 kw 3 m/min |
| Precursor retention time (sec) | 1 | 3 | 5 | 0.1 | 5 | 20 |
| Precursor purge time (sec) | 5 | 10 | 10 | 5 | 10 | 20 |
| Reactant retention time (sec) | 3 | 3 | 3 | 3 | 3 | 5 |
| Reactant retention time (sec) | 15 | 15 | 15 | 15 | 15 | 30 |
| Number of cycles of ALD | 92 | 60 | 45 | 150 | 50 | 58 |
| GR (growth rate A/cycle) | 0.15 | 0.15 | 0.10 | 0.14 | 0.10 | 0.15 |
| Flow direction (type) | Cross | Cross | Cross | Cross | Cross | Shower head |
| Basic pressure (torr) | 0.1 | 0.006 | 0.003 | 1 | 0.003 | 0.4 |
| Process pressure (torr) | 1 | 1 | 1 | 1 | 1 | 0.65 |
| Temperature (° C.) | 25 | 90 | 50 | 50 | 50 | 90 |
| Carrier gas (sccm) | 1500 | 2000 | 2000 | 1000 | 2000 | 100 |

As illustrated in Table 2, it can be seen that only a portion of the internal surfaces of the pores, and not the entirety of the internal surfaces thereof, is coated, from the ratios of the actual deposition weights to the theoretical weights and the deposition thicknesses that are shown. Comparative Example 1 indicates that since the deposition amount was not sufficient, the shrinkage was high, and Comparative Example 2 indicates that since the deposition amount was great, the shrinkage was low, but an increase in the gas permeability measured after the separator remained at 200° C. for one hour was low. Comparative Example 3 indicates that since the aluminum oxide layer was deposited on the entirety of the internal surfaces of the pores, the shrinkage was low, but the increase in the gas permeability measured after the separator remained at 200° C. for one hour was significantly low.

Examples 1 to 3 exhibit excellent shrinkage properties, as compared with Comparative Example 1, and exhibit excellent shutdown properties, as compared with Comparative Examples 2 and 3.

Thus, it can be seen that the separator having an actual weight to theoretical weight ratio of 10% to 50%, indicating a deposition rate, may ensure excellent shrinkage properties and shutdown properties.

The physical properties of the porous polymer substrate, illustrated in FIG. 1, and the separators obtained in Examples 1 to 3 and Comparative Examples 1 to 3, were measured by the following methods.

Thickness of film: A contact-type thickness measuring instrument having a thickness accuracy of 0.1 µm was used.

Mean pore diameter: The mean pore diameter was measured by a half-dry method, using a porometer (PMI Co.), based on ASTM F316-03.

Porosity: A rectangular sample having a dimension of A cm×B cm was cut from the porous polymer substrate and the separators, and the porosity of the cut rectangular sample was calculated by the following Formula 1. A and B may range from 5 cm to 20 cm, respectively.

$$\text{Space rate} = \{(A \times B \times T) - (M \div \rho) \div (A \times B \times T)\} \times 100 \quad \text{[Formula 1]}$$

In Formula 1, T is the thickness (cm) of the separators, M is the weight (g) of the rectangular sample, and $\rho$ is the density (g/cm$^3$) of the resin material.

Gas permeability (Gurley densometer): The gas permeability indicates a time (second) at which a gas having a volume of 100 mL passes through an area of 1 inch$^2$ at about a pressure of 1 psig to 2 psig, and was measured using a Gurley densometer (Toyo Seiki Seisku-Sho, Ltd.).

Deposition thickness: The deposition thickness of the inorganic metal compound formed on the composite microporous layer, using the ALD process, was replaced with a thickness measured using a reflectometer, after the inorganic metal compound was deposited on a silicon (Si) wafer under the same deposition conditions.

Shrinkage: When a Teflon sheet was interposed between glass plates and a force of 7.5 mg/mm$^2$ was applied to the composite microporous layer to be measured, the Teflon sheet, the glass plates, and the composite microporous layer remained in an oven set to 200° C. for one hour, and the shrinkages thereof were measured in the MD and the TD thereof to calculate the final area shrinkages (%) thereof.

TMA maximum shrinkage and melt fracture temperature: Using a TMA device (Mettler-Toledo International Inc.), a sample having a dimension of 6 mm×10 mm and having a weight of 0.015 N was heated at a rate of 5° C./min.

A sample, manufactured via a stretching process, may shrink at a temperature, and when the temperature of the sample exceeds a glass transition temperature (Tg) and a melting temperature (Tm), the sample may be elongated due to the weight of the weight.

The TMA maximum shrinkage may be defined as a value in which a rate of a shrunken length to an initially measured length (zero point) of the sample is represented by a percentage (%) at a maximum shrinkage point thereof, generated at a temperature, and may start to elongate due to the weight of the weight. In an embodiment, a temperature at which the length of the sample starts to exceed the initially measured length, may be defined as the melt fracture temperature.

Further, in the case of a sample which has not shrunk, an x-axis temperature gradient of the sample may be defined as a melt fracture temperature when the sample is maximally elongated, according to the temperature rise thereof.

As set forth above, according to an embodiment, a heat-resistant coating layer may be formed on a portion of internal surfaces of pores to form a network structure, so as to maintain an overall structure of a separator even when thermal energy is injected thereinto, thereby avoiding thermal contraction thereof, while preventing shutdown properties thereof from decreasing. As a result, a separator having excellent heat resistance and shutdown properties may be implemented.

According to an embodiment, the heat-resistant coating layer may be formed on an entirety of a surface of a porous polymer substrate, using an atomic layer deposition (ALD) process, thereby ensuring heat resistance properties. Accordingly, the separator may be prevented from shrinking, and thus internal short circuits of a secondary cell due to a contact between an anode and a cathode thereof may be avoided.

Since internal surfaces of pores included in the porous polymer substrate have a region having a heat-resistant coating layer formed thereon, and a region having a non-heat-resistant coating layer formed thereon, when the secondary cell generates an abnormal amount of heat, a thermally molten resin may induce the pores to be occluded in the region having a non-heat-resistant coating layer formed thereon, thereby improving shutdown properties of the separator.

As a result, according to an embodiment, the separator may increase heat resistance properties thereof and shutdown properties thereof, thereby improving safety of the secondary cell.

While exemplary embodiments have been shown and described above, it will be apparent to those skilled in the art that modifications and variations could be made without departing from the scope of the present invention, as defined by the appended claims.

What is claimed is:

1. A method of manufacturing a separator for a secondary cell, the method comprising:
    forming heat-resistant coating layers such that a coating amount of 3.40 to 6.63 g/m$^2$ is formed by repeating cycles of an atomic layer deposition process for a porous polymer substrate having a first surface, a second surface opposing the first surface, and a plurality of pores connecting the first surface to the second surface,
    each of the cycles of the atomic layer deposition process comprising:
        forming a metal compound layer containing a metal by allowing metal compound vapor including at least one of aluminum, calcium, magnesium, silicon, titanium, and zirconium to react with the first surface and the second surface of the porous polymer substrate;

forming a solid ceramic layer containing a nonmetal and a metal by allowing nonmetal compound vapor including at least one of carbon, nitrogen, sulfur, and oxygen to react with a metal compound contained in the formed metal compound layer; and forming a layer containing a metal on a portion of internal surfaces of the pores by controlling an amount of the metal compound vapor supplied to an entirety of a reaction area of the porous polymer substrate, wherein the heat-resistant coating layers formed on the internal surfaces of the pores have a thickness of 70% or lower based on a thickness of the heat-resistant coating layers formed on the first surface and the second surface of the porous polymer substrate, during the forming the metal compound layer and the forming the solid ceramic layer, in each of the cycles of the atomic layer deposition process.

2. The method of claim 1, wherein the layer containing the metal is formed on the portion of the internal surfaces of the pores by additionally controlling the number of repetitions of the cycles of the atomic layer deposition process and a reaction time required for the forming the metal compound layer.

3. The method of claim 1, wherein a weight percentage of the heat-resistant coating layers is within a range from 10% to 50%, based on a theoretical weight percentage thereof, and the theoretical weight percentage is defined as a total weight percentage of heat-resistant coating layers coated on the first surface and the second surface of the porous polymer substrate and onto the internal surfaces of the pores at the same thickness as an average thickness of the heat-resistant coating layers formed on the first surface and the second surface of the porous polymer substrate.

4. The method of claim 1, wherein the metal compound vapor is formed of at least one of $AlCl_3$, tri-methyl-aluminum, $Al(CH_3)_2Cl$, $Al(C_2H_5)_3$, $Al(OC_2H_5)_3$, $Al(N(C_2H_5)_2)_3$, $Al(N(CH_3)_2)_3$, $SiCl_4$, $SiCl_2H_2$, $Si_2Cl_6$, $Si(C_2H_5)H_2$, $Si_2H_6$, $TiF_4$, $TiCl_4$, $TiI_4$, $Ti(OCH_3)_4$, $Ti(OC_2H_5)_4$, $Ti(N(CH_3)_2)_4$, $Ti(N(C_2H_5)_2)_4$, $Ti(N(CH_3)(C_2H_5))_4$, $VOCl_3$, $Zn$, $ZnCl_2$, $Zn(CH_3)_2$, $Zn(C_2H_5)_2$, $ZnI_2$, $ZrCl_4$, $ZrI_4$, $Zr(N(CH_3)_2)_4$, $Zr(N(C_2H_5)_2)_4$, $Zr(N(CH_3)(C_2H_5))_4$, $HfCl_4$, $HfI_4$, $Hf(NO_3)_4$, $Hf(N(CH_3)(C_2H_5))_4$, $Hf(N(CH_3)_2)_4$, $Hf(N(C_2H_5)_2)_4$, $TaCl_5$, $TaF_5$, $TaI_5$, $Ta(O(C_2H_5))_5$, $Ta(N(CH_3)_2)_5$, $Ta(N(C_2H_5)_2)_5$, or $TaBr_5$.

5. The method of claim 1, wherein after a preprocessing process of applying a functional group to the porous polymer substrate is conducted, the cycles of the atomic layer deposition process are performed.

6. The method of claim 5, wherein the functional group is formed on the portion of the internal surfaces of the pores.

7. The method of claim 5, wherein the functional group is formed by allowing at least one of water, oxygen, ozone, hydrogen, hydrogen peroxide, alcohol, $NO_2$, $N_2O$, $NH_3$, $N_2$, $N_2H_4$, $C_2H_4$, $HCOOH$, $CH_3COOH$, $H_2S$, $(C_2H_5)_2S_2$, or $CO_2$ to react with the portion of the internal surfaces of the pores, using an ultraviolet ray (UV) irradiation treatment or a plasma treatment.

8. The method of claim 5, wherein the preprocessing process is performed by adjusting at least one of processing strength, processing time, and the number of times of processing.

* * * * *